US006867133B2

(12) United States Patent
Kanetaka et al.

(10) Patent No.: US 6,867,133 B2
(45) Date of Patent: Mar. 15, 2005

(54) METHOD OF MANUFACTURING CHIP INDUCTOR

(75) Inventors: Toyonori Kanetaka, Hyogo (JP); Toshihiro Yoshizawa, Osaka (JP); Akira Fujimori, Hyogo (JP); Hideaki Nakayama, Hyogo (JP); Hiromasa Yamamoto, Osaka (JP); Mikio Taoka, Osaka (JP); Kenichi Yamada, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 528 days.

(21) Appl. No.: 10/009,750

(22) PCT Filed: Apr. 12, 2001

(86) PCT No.: PCT/JP01/03149

§ 371 (c)(1), (2), (4) Date: Apr. 30, 2002

(87) PCT Pub. No.: WO01/78092

PCT Pub. Date: Oct. 18, 2001

(65) Prior Publication Data

US 2002/0151114 A1 Oct. 17, 2002

(30) Foreign Application Priority Data

| | | |
|---|---|---|
| Apr. 12, 2000 | (JP) | 2000-110263 |
| Apr. 12, 2000 | (JP) | 2000-110264 |
| Apr. 12, 2000 | (JP) | 2000-110265 |
| Apr. 12, 2000 | (JP) | 2000-110266 |

(51) Int. Cl.[7] .......................... H01L 23/02; H01F 27/28

(52) U.S. Cl. ........................ 438/678; 336/223; 257/531

(58) Field of Search .......................... 336/83, 200, 223, 336/232; 257/531; 438/678

(56) References Cited

U.S. PATENT DOCUMENTS

| | | | | |
|---|---|---|---|---|
| 5,441,783 A | * | 8/1995 | Silgailis et al. | 428/37 |
| 6,084,500 A | * | 7/2000 | Kanetaka et al. | 336/223 |
| 6,388,550 B1 | * | 5/2002 | Kanetaka et al. | 336/223 |

FOREIGN PATENT DOCUMENTS

| | | |
|---|---|---|
| JP | 62-286211 | 12/1987 |
| JP | 6-96952 | 4/1994 |
| JP | 8-78290 | 3/1996 |
| JP | 10-125533 | 5/1998 |
| JP | 11-3820 | 1/1999 |
| JP | 11-260647 | 9/1999 |
| JP | 2000-30952 | 1/2000 |
| JP | 2000-58336 | 2/2000 |
| JP | 2000-64094 | 2/2000 |

* cited by examiner

*Primary Examiner*—Matthew Smith
*Assistant Examiner*—Calvin Lee
(74) *Attorney, Agent, or Firm*—McDermott Will & Emery LLP

(57) ABSTRACT

Method of manufacturing a chip inductor including the steps of, a conductive layer forming process for forming conductive layer 4 on an outer periphery 2 and end surfaces 3 of a substrate 1, a coil portion forming process for forming coil portion 7 having conductor 5 and groove 6 by cutting spirally the conductive layer 4, an etching process for etching the substrate 1 having the coil portion 7 formed thereon; an insulation resin coating process for forming outer coating 8 by coating a surface of the conductive layer 4 with insulation resin 13; and an electrode forming process for forming electrodes 9 at both ends of the coil portion 7, and for making electric contacts between electrodes 9 and the conductive layer 4. A chip inductor having a flattened mounting surface of the outer coating is obtained when insulation resin layer 8 is formed by an electrodeposition method in the insulation resin coating process. The chip inductor can be securely mounted to a circuit board.

31 Claims, 15 Drawing Sheets

(a)

(b)

(c)

(a)

(b)

(a)

(b)

(c)

(a)

(b)

METHOD OF MANUFACTURING CHIP INDUCTOR

FIELD OF THE INVENTION

The present invention relates to a method of manufacturing chip inductor for use in a variety of consumer electronic equipment and the like.

BACKGROUND OF THE INVENTION

With reference to the accompanying drawings, a conventional method of manufacturing chip inductor will be described hereinafter.

FIG. 18 illustrates a conventional manufacturing process of a chip inductor, FIG. 19 is a cross sectional view of the chip inductor, and FIG. 20 is a perspective view of the chip inductor.

In FIG. 18 through FIG. 20, the conventional method of manufacturing the chip inductor comprises a first step of forming conductive layer 32 on rectangular prism substrate 31 made of insulating material of approximately 0.5 mm square by 1 mm in length, a second step of forming coil portion 35 having spiral conductor 33 and groove 34 by slitting the conductive layer 32 spirally with laser 37, a third step of forming electrodes 36 at both ends of the coil portion 35, and a fourth step of forming outer coating 39 by coating the coil portion 35 with insulation resin 38, followed by heating.

In the fourth step, the coil portion 35 is coated on its entire periphery with the insulation resin 38 by rolling the substrate 31 in a direction of (A) on a tape coated with the insulation resin 38.

Thereafter, the insulation resin 38 is heated to form the outer coating 39.

In the above-described method of the prior art, since the insulation resin 38 is coated while rolling the substrate 31 on the tape coated with the insulation resin 38, an external shape of the insulation resin 38 enclosing the prism substrate 31 becomes cylindrical, as shown in the cross sectional view of FIG. 19, due to its surface tension.

The chip inductor is especially susceptible to an influence of surface tension of the insulation resin 38, because of very small external dimensions of its main body, which is approximately 0.5 mm square by 1 mm in length.

This causes a surface of the outer coating 39 to become round, thereby giving rise to a problem that it can not be mounted properly to a circuit board or the like as it rotates when it is mounted.

The present invention addresses the above-described problem, and is intended to provide a method of manufacturing chip inductor that makes a mounting surface of the outer coating flat, so as to assure reliable mounting.

SUMMARY OF THE INVENTION

In a manufacturing process of chip inductor, the present invention comprises an electrodeposition coating process, in which an element main body having a coil portion formed thereon is dipped into a bath for electrodepositing a insulation resin, and an electric field is applied between a conductor of the coil and the resin bath, to cover the coil with the resin by depositing the electrodeposition insulation resin at least on a surface of the conductor of the coil.

The above-described method covers the coil with the electrodeposition insulation resin, instead of coating it with an insulation resin, thereby avoiding an external shape of outer coating from becoming round due to surface tension of the insulation resin, even if external dimensions of the chip inductor are considerably small. Therefore, this produces an external shape that generally resemble to an external shape of a conductive layer, so as to make the outer coating flat, and to improve easiness of mounting of the chip inductor to a circuit board or the like.

THE BEST MODE FOR CARRYING OUT THE INVENTION

First Exemplary Embodiment

With reference to the accompanying drawings, the present invention as set forth in claims 1 through claim 9 is described according to the exemplary embodiment.

Figure 1:
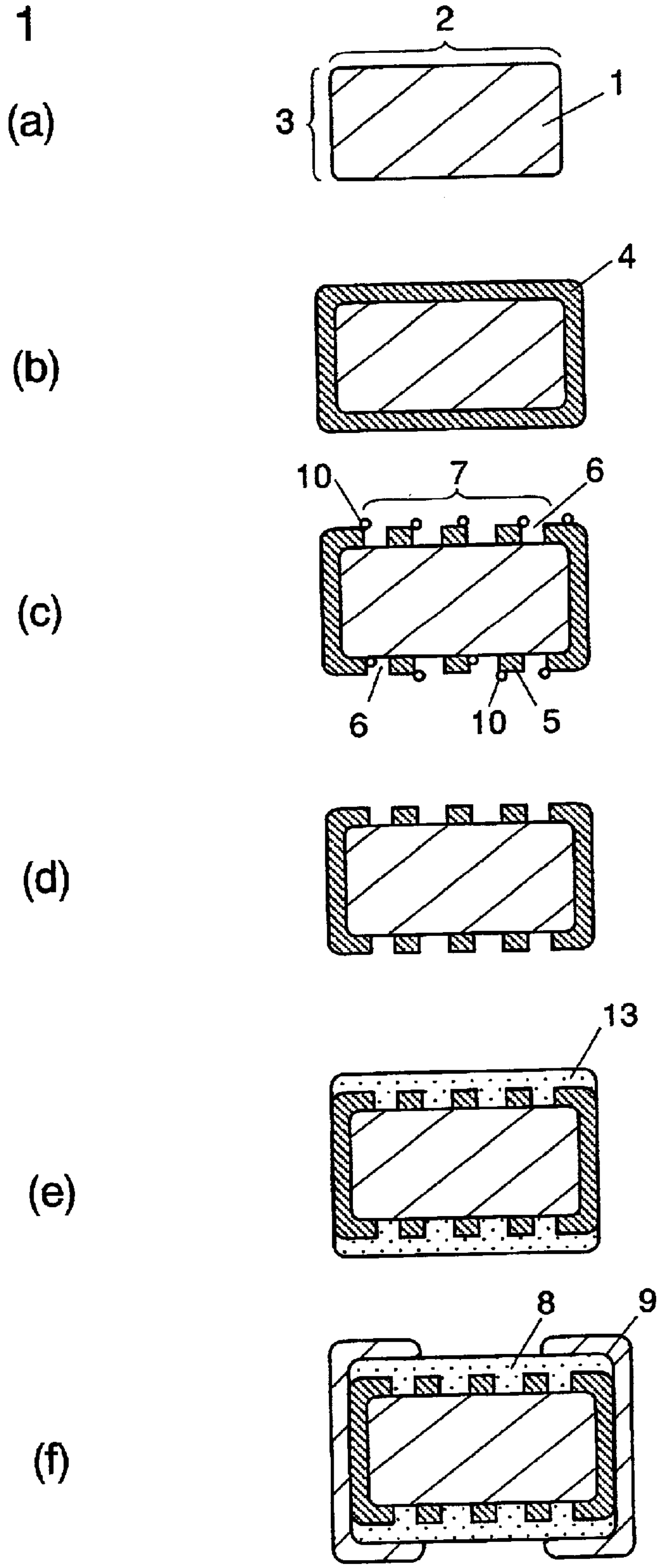
FIGS. 1(*a*) to 1(*f*) illustrate a manufacturing process of chip inductor according to a first exemplary embodiment of the present invention.
Figure 5:
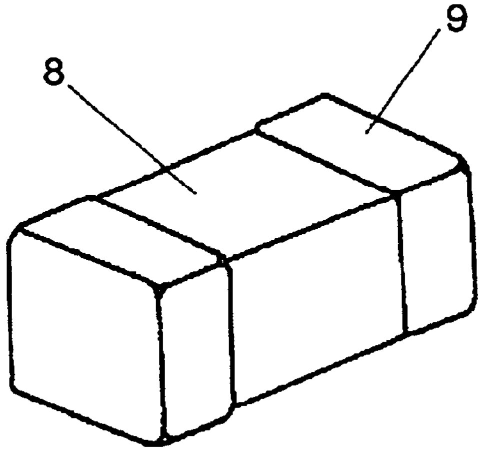
FIG. 5 is a perspective view of the chip inductor.

Referring to FIG. 1 though FIG. 5, a method of manufacturing chip inductor according to this exemplary embodiment of the invention comprises:

a conductive layer forming process for forming conductive layer 4 on outer periphery 2 and end surfaces 3 of substrate 1 made of insulating material having a prism shape of approximately 0.5 mm square by 1 mm in length;

a coil portion forming process for forming coil portion 7 having conductor 5 and groove 6 by cutting spirally the conductive layer 4 formed on the outer periphery 2 of the substrate 1 while removing cutting dust 10 of the conductive layer 4;

an etching process for etching the chip inductor element having the coil portion 7 formed thereon;

an insulation resin coating process for forming outer coating 8 by coating the outer periphery 2 and the conductive layer 4 of the etched element with insulation resin 13;

and an electrode forming process for forming electrodes 9 at both ends of the coil portion 7, and for making electrical contacts between the electrodes 9 and the conductive layer 4.

Figure 2:
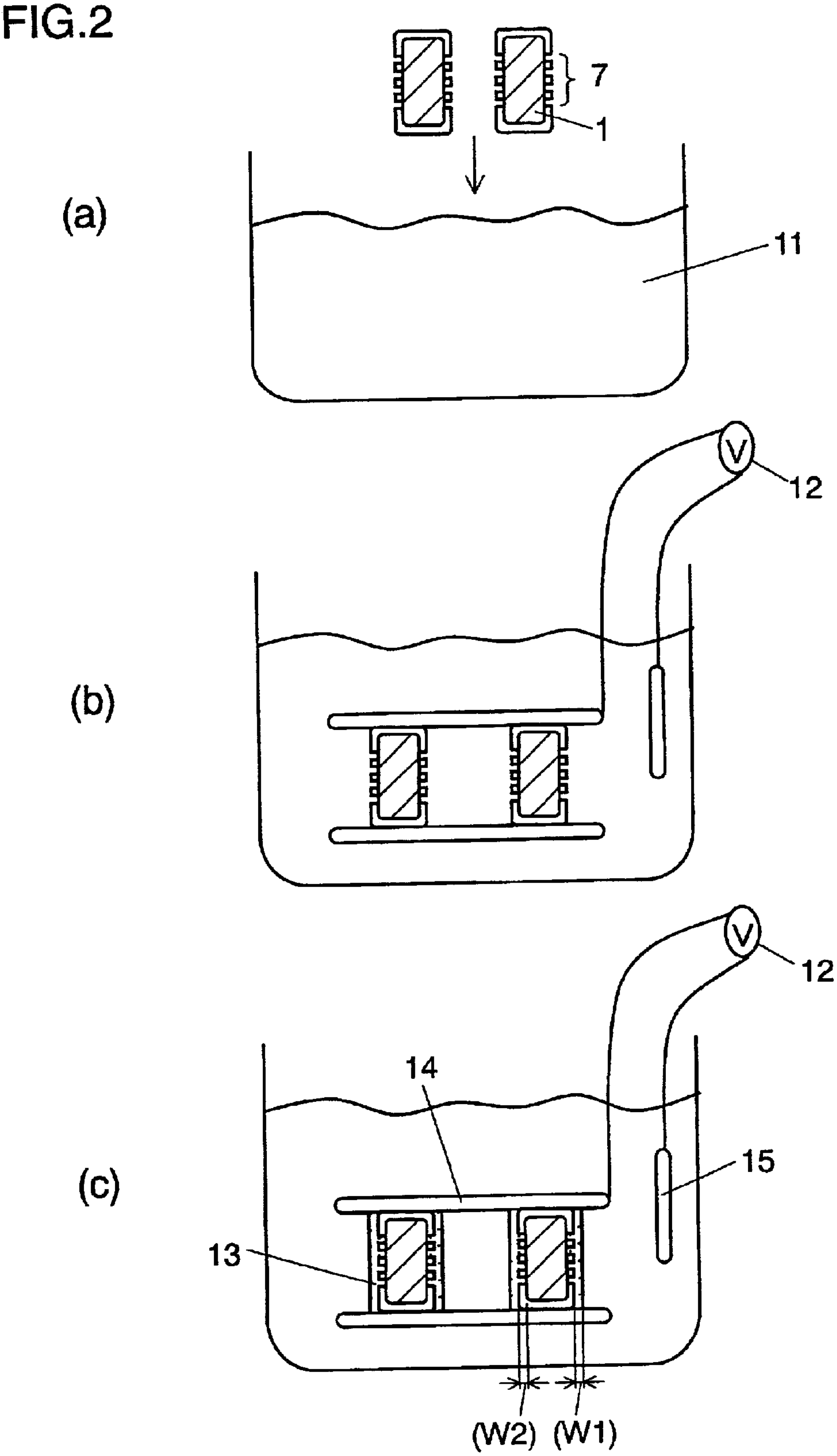
FIGS. 2(*a*) to 2(*c*) illustrate an electrodeposition coating process of the chip inductor.

Furthermore, in the insulation resin coating process, the substrate 1 having the coil portion 7 formed thereon is dipped into epoxy-based insulation resin bath 11 for electrodeposition while being hold by holder 14, and an electric field is applied between the conductor 5 of the coil portion 7 and the resin bath 11, as shown in FIG. 2. The electric field is applied by power supply 12 connected between electrode plate 15 and the holder 14. Application of the electric field causes the electrodeposition insulation resin to deposit on at least a surface of the conductor 5, to cover the coil portion 7 as insulation resin 13. As described, the insulation resin coating process includes an electrodeposition process. Electrophoretic resin generally available on the market can be used as the electrodeposition resin.

In the electrodeposition process, surfaces of the conductive layer 4 formed on the both end surfaces 3 of the substrate 1 are not exposed to the electrodeposition insulation resin in the resin bath 11, as shown in FIG. 2(*b*), so as not to be coated with the insulation resin 13. In addition, there is provided an electric-field controlling process to cease application of the electric field before thickness (W1) of the insulation resin 13 covering the coil portion 7 become greater than thickness (W2) of the conductive layer 4, as shown in FIG. 2(*c*).

Furthermore, there are cleaning process for washing the insulation resin 13, after the electrodeposition process, as well as heating process, thereafter, for heating the insulation resin 13 to cure.

In the heating process, the insulation resin 13 is heated at a temperature lower than its curing temperature, and then at another temperature higher than the curing temperature of the resin to cure the insulation resin 13.

Figure 3:
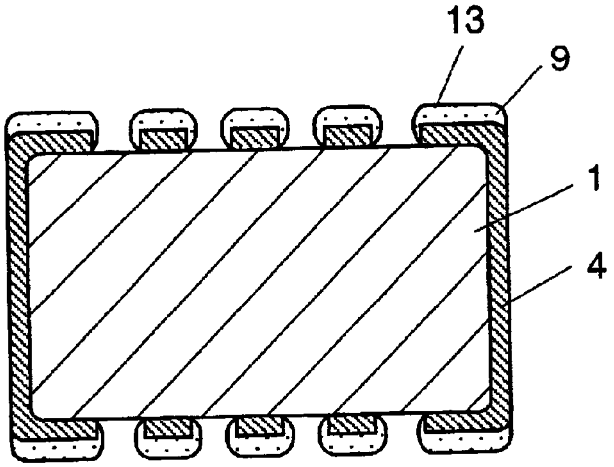
FIGS. 3(*a*) to 3(*c*) illustrate a heating process of the chip inductor.
Figure 3:
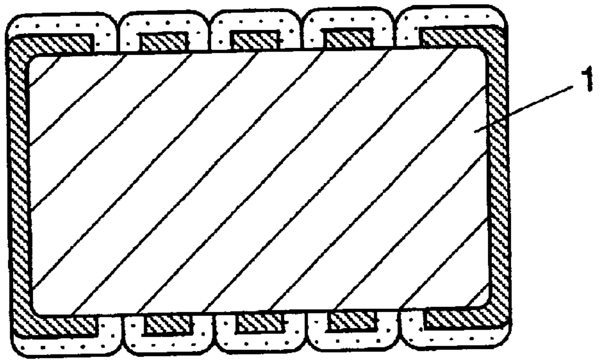
Figure 3:
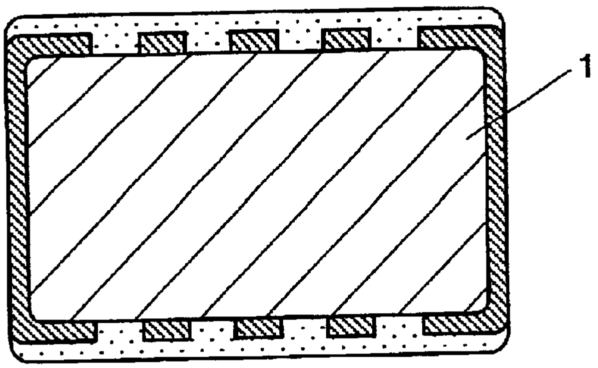

More specifically, in the heating process, the insulation resin 13 is heated at a temperature (130° C.) that is lower than the curing temperature to allow the insulation resin 13 to flow and to fill grooves 6 in the coil portion 7, as shown in FIG. 3(*b*). The insulation resin 13 is then heated at a temperature (230° C.) higher than the curing temperature to form a continuous layer of the insulation resin, as shown in FIG. 3(*c*).

According to the foregoing method, the insulation resin 13 is not formed by a coating method, but the electrodeposition insulation resin is deposited only on the conductor 5, and cover the entire coil portion 7. Thus, an amount of the coated insulation resin 13 can be controlled accurately as described above, so as to avoid an external shape of the outer coating 8 from becoming round due to surface tension of the insulation resin 13, even if external dimensions of the substrate 1 are substantially small. In other words, an external shape of the chip inductor becomes what is generally the same to an external shape of the conductive layer 4, thereby making the outer coating 8 flat, and improving easiness of mounting it to a circuit board or the like.

In particular, since there is the electric-field controlling process provided in the electrodeposition process to cease application of the electric field before the thickness of the insulation resin 13 becomes greater than thickness of the conductive layer 4, the chip inductor can be miniaturized by reducing the thickness of the insulation resin 13. This makes the external shape of the insulation resin 13 to be the same more accurately to the external shape of the conductive layer 4, so as to further improve flatness of the mounting surface.

Figure 4:
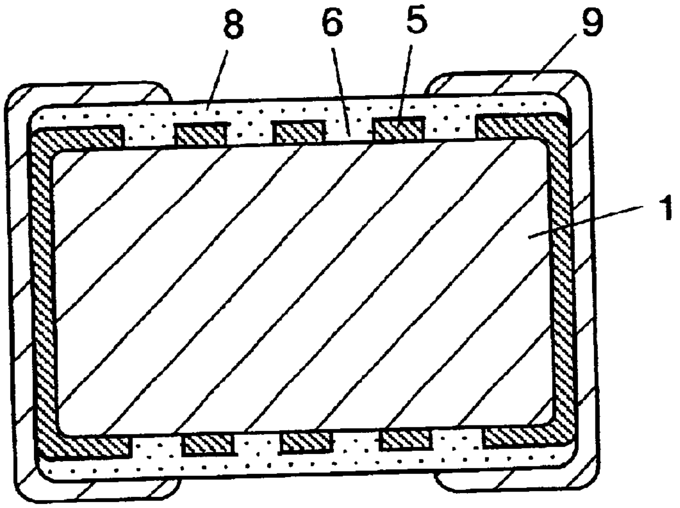
FIG. 4 is a sectional view of the chip inductor.

In the electrodeposition process, surfaces of the conductive layer 4 formed on both end surfaces 3 of the substrate 1 are not deposited with the insulation resin 13. This allows electrical contacts between electrodes 9 and the conductive layers 4 when the electrodes 9 are formed at both ends of the coil portion 7. In addition, it also improves reliability of contacts, since surface area of the contacts between the electrodes 9 and the conductive layers 4 can be very large, as shown in FIG. 4.

Furthermore, because there is also the heating process for heating and curing the insulation resin 13 after the electrodeposition process, the outer coating can be formed adequately by curing the insulation resin 13 after the coil portion 7 is covered with the insulation resin 13.

In the heating process, the insulation resin 13 is heated at the temperature lower than the curing temperature, and thereafter, at another temperature higher than the curing temperature of the insulation resin 13. Therefore, the insulation resin 13 deposited to the conductors 5 fills the grooves 6 between adjoining conductors 5 due to its flow property when it is heated at the lower temperature than the curing temperature of the insulation resin 13. Thus, flat surface of the insulation resin 13 is obtained, and a mounting procedure becomes easy.

The insulation resin 13 covering the coil portion 7 securely fills the grooves 6 between the conductors 5 by the flow property of the insulation resin 13. Because the insulation resin 13 is heated at the higher temperature than the curing temperature of the insulation resin 13, especially after the insulation resin 13 fill the grooves 6 of the coil portion 7, a formation of voids in the grooves 6 can be prevented.

Accordingly, short-circuiting between adjoining conductors 5 and corrosion and the like of the conductors 5 due to an invading of moisture or the like into the grooves 6 are eliminated, and the reliability becomes improved.

Also, because the cleaning process for cleaning the insulation resin 13 is included prior to the heating process, resin bath 11 simply adhering to the substrate 1 after it is dipped into the resin bath 11 in the insulation resin coating process can be washed out in the cleaning process. This further improves flatness of the outer coating 8, since it eliminates excess amount of electrodeposition insulation resin to flow and cure, and only the insulation resin 13 deposited on the conductors 5 of the substrate 1cures.

Since the insulation resin specifically used for the electrodeposition is epoxy-based resin, it is easily deposited on the conductors 5.

According to the present exemplary embodiment, as described above, flatness of the outer coating 8 is obtained, and the mounting of the chip inductor to a mount board and the like becomes easy.

Moreover, since large area electrical contacts are made between the electrodes 9 and the conductive layers 4 without the outer coating 8 in between, it improves reliability of the contacts.

In addition, since the insulation resin 13 heated at the lower temperature than the curing temperature securely fills the grooves 6, it eliminates short-circuiting between the adjoining conductors 5 and corrosion of the conductors 5, so as to improve the reliability. A good result was obtained for the resin used in this exemplary embodiment especially when the lower temperature than the curing temperature was set at 130° C. and the higher temperature at 230° C.

However, these temperatures are changed, naturally, depending on a kind of the resin and curing agent used.

In this exemplary embodiment, although the grooves 6 in the coil portion 7 are not cut into a body of substrate 1, the grooves may be cut into the body of substrate 1.

Second Exemplary Embodiment

With reference to the accompanying drawings, the present invention as set forth in claims 11 through claim 19 will be described hereinafter according to the exemplary embodiment.

A method of manufacturing chip inductor in the second exemplary embodiment is a further improvement of the first exemplary embodiment.

Figure 6:
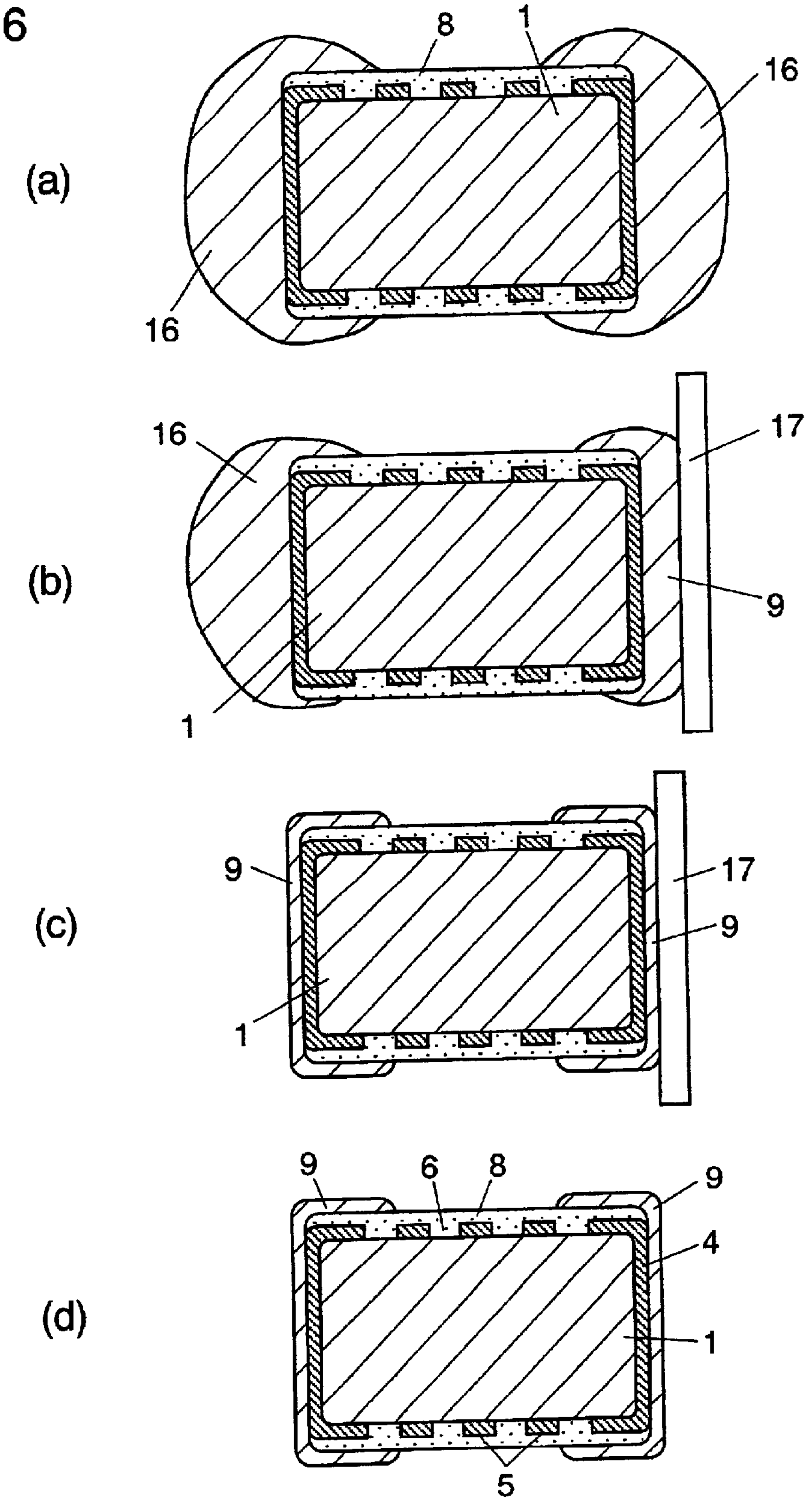
FIGS. 6(*a*) to 6(*d*) illustrate an electrode forming process of a chip inductor according to a second exemplary embodiment of the present invention.
Figure 7:
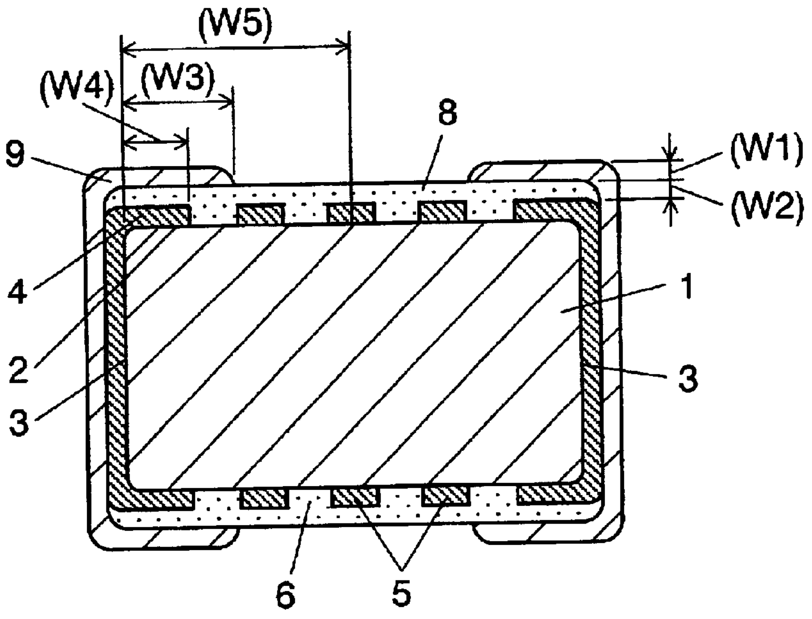
FIG. 7 is a sectional view of the chip inductor.
Figure 8:
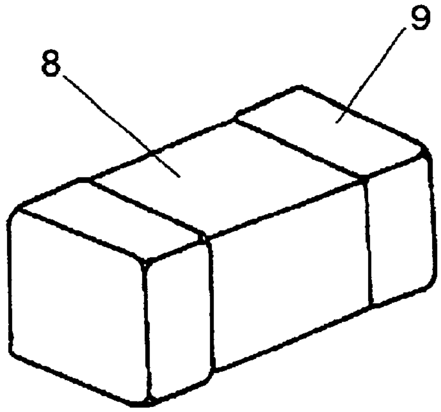
FIG. 8 is a perspective view of the chip inductor.

FIG. 6(*a*) through 6(*d*) illustrate an electrode forming process of the chip inductor according to the present exemplary embodiment, FIG. 7 is a sectional view of the chip inductor, and FIG. 8 is a perspective view of the chip inductor.

In this exemplary embodiment, detailed descriptions are omitted up to the electrodeposition coating process, as they are the same as those in FIG. 1 and FIG. 2 in the first exemplary embodiment.

In the electrode forming process of this embodiment includes a process of forming electrodes 9 on outer coating 8 over conductive layer 4 formed on outer periphery 2 of the substrate 1. In the electrode forming process, the electrodes 9 are formed in a manner that conductive resin 16 is coated on parts of the conductive layers 4 formed on the end surfaces 3, and the coated surfaces are flattened thereafter by a flattening plate 17 pressed thereon, as shown in FIGS. 6(*a*) and 6(*b*), followed by a curing of the conductive resin 16.

In addition, each electrode 9 is so formed that thickness (W1) of the electrode 9 formed around the outer periphery 2 of the substrate 1 is less than thickness (W2) of the outer coating 8 formed over the outer periphery 2 of the substrate 1, as shown in FIG. 7.

The electrode 9 is formed on the outer coating 8 from the end surface 3 extending at least to a position (W3) that faces conductor 5. And, in particular, the width (W3) of the electrodes 9 formed over the outer periphery 2 of the substrate 1 is larger than ⅙ (W4) of a length of the substrate 1 but smaller than a half (W5) of the length.

According to the method of manufacturing of this embodiment, the following advantages are obtained, in addition to the advantages of the first exemplary embodiment. That is, the electrodes 9 can be formed on the outer coating 8, even if the conductors 5 are provided over an entire surface of the outer periphery 2 of the substrate 1, since the electrodes 9 are formed over the conductive layers 4 with outer coating 8 in between. In the foregoing manner, this embodiment provides the possibility of increasing a coil area even with the same size of the substrate is used, thereby allowing an increase in inductance while realizing miniaturization at the same time.

Especially, since the electrodes 9 are provided on the outer periphery of the substrate 1, the Manhattan phenomenon (a phenomenon in which one end of a chip component lift up, and a connection between the circuit board and any of the electrodes 9 fails) during soldering to a circuit board can be eliminated, thereby improving reliability of the mounting.

Furthermore, since there is a process of forming the conductive layers 4 on both end surfaces 3 of the substrate 1, the electrodes 9 can be formed also on the both end surfaces 3 of the substrate 1. This further improves a mounting reliability.

The electrodes 9 are formed especially in such a configuration that thickness of the electrodes 9 formed on the outer periphery 2 of the substrate 1 is thinner than the thickness of the outer coating 8 formed on the outer periphery 2 of the substrate 1. This eliminates a peeling-off of the electrodes 9 while attaining a low-profile structure, even when the electrodes 9 are formed over the outer coating 8, so as to improve reliability.

The electrodes 9 can be formed precisely, since they are formed in the manner that conductive resin 16 is coated and cured. In addition, because the conductive resin 16 is cured after it is coated and the coated surface is flattened by being pressed against flattening plate 17, the mounting surface of the electrodes 9 can be made flat to improve easiness of mounting.

The width (W3) of the electrodes 9 is so arranged that it is larger than ⅙ (W4) of a width of the outer periphery of the substrate 1 but smaller than a half (W5) of the substrate 1. This securely eliminates the Manhattan phenomenon during soldering of the electrodes 9 to the circuit board and the like, thereby improving the connection reliability.

According to the second embodiment of the present invention, in addition to the advantage of the first embodiment, there are such advantages as an increase in inductance while realizing miniaturization, and an improvement in connection reliability. In addition, it also avoids the electrodes 9 from the peeling-off, so as to also improve the reliability.

According to the second embodiment of the present invention, the electrodes 9 are formed from the end surfaces 3 of the substrate 1 up to at least the positions where each faces their respective conductor 5, in the electrode forming process. However, the electrodes 9 may be formed in a manner that they locate between the end surfaces 3 of the substrate 1 to the conductor 5. In other words, the outer coating 8 is removed partly or entirely, and the electrodes 9 are connected to the conductive layer 4 at the removed area. The peeling-off of the electrodes 9 can be suppressed in this case, as compared to the case in which the electrodes 9 are formed over the outer coating 8. Well known means such as laser beam stripping, machine cutting, and the like can be used for the removal of the outer coating 8.

Figure 9:
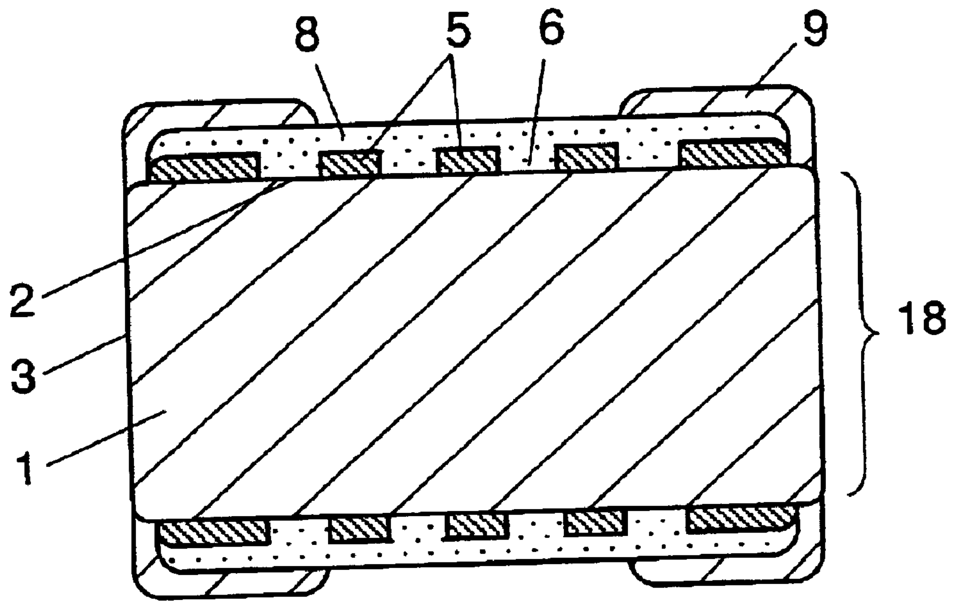
FIG. 9 is a sectional view of another chip inductor according to the second exemplary embodiment of the present invention.

In addition, although the conductive layer 4 is formed on both end surfaces 3 of the substrate 1 in the conductive layer forming process of the present invention, a process may be employed that does not form the conductive layer 4 on the both end surfaces 3 of the substrate 1, leaving these surfaces not coated with conductive-layer, as shown in FIG. 9. In this instance, the inductance can be increased while achieving miniaturization, since there is no conductive substance on the end surfaces 3 of the substrate 1 to shield magnetic flux generated by the coil portion 7. The conductive layer 4 and the electrodes 9 can be connected even in this case by removing the outer coating 8 partially or entirely.

Alternatively, the holder 14 shown in FIG. 2 may be made of a conductive elastic member, to produce non-deposited areas where the outer coating 8 is not formed at the ends of the conductive layer 4.

Third Exemplary Embodiment

Referring now to the accompanying drawings, the invention as set forth in claims 20 through claim 25 will be described hereinafter according to this exemplary embodiment.

A method of manufacturing chip inductor in this exemplary embodiment is a further improvement of the method of manufacturing the chip inductor of the first exemplary embodiment.

Figure 10:
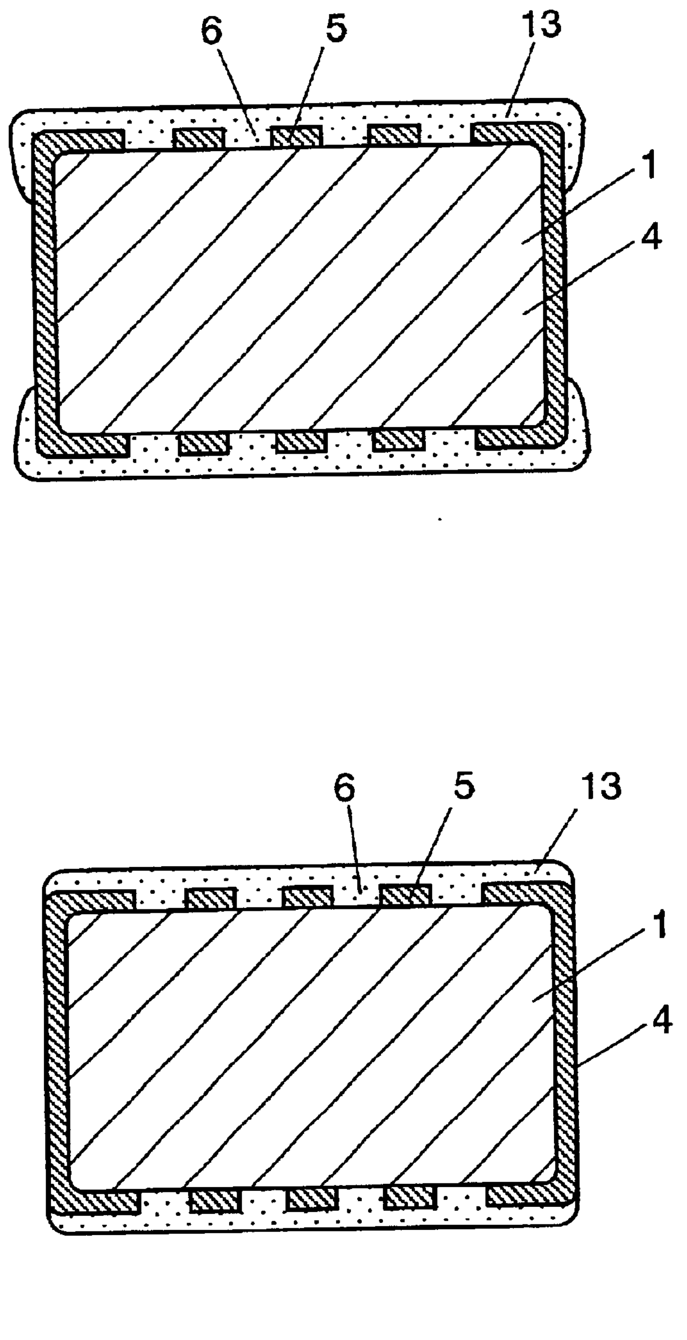
FIG. 10 is a sectional view of a chip inductor according to a third exemplary embodiment of the present invention.
Figure 11:
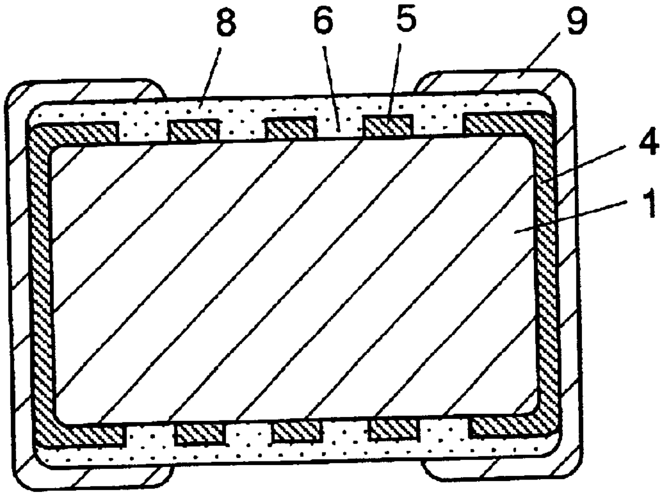
FIG. 11 is a sectional view of the chip inductor.
Figure 12:
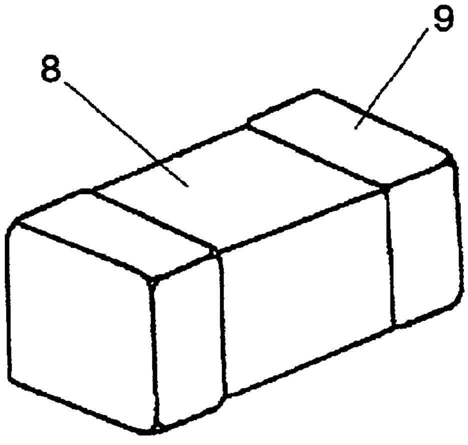
FIG. 12 is a perspective view of the chip inductor.

FIGS. 10(*a*) and 10(*b*) are sectional views of chip inductors according to the third exemplary embodiment of the present invention, FIG. 11 is a sectional view of another chip inductor, and FIG. 12 is a perspective view of the chip inductor.

Detailed descriptions are omitted up to the electrodeposition coating process, as they are same as those in FIG. 1 and FIG. 2 in the first exemplary embodiment. According to the present exemplary embodiment, a process is provided to form conductive layers 4 on both end surfaces 3 of the substrate 1, in the conductive layer forming process. There is also another process, in the electrode forming process, to cut surfaces of the conductive layers 4 formed on the both end surfaces 3 of the substrate 1.

In the electrode forming process, the laser beam is scanned for a plurality of times to cut the surfaces of the conductive layers 4 formed on the both end surfaces 3 of the substrate 1. A cutting depth to cut the surfaces of the conductive layers 4 is an extent that does not expose the both end surfaces 3 of the substrate 1.

The following advantages can be obtained according to the foregoing method, in addition to the advantages of the first exemplary embodiment as shown in FIGS. 10(*a*) and 10(*b*). That is, since the process includes cutting process of the surfaces of the conductive layers 4 formed on the both end surfaces 3 of the substrate 1, the insulation resin 13 can be removed by the cutting, as shown in FIG. 10(*b*), even if the conductive layers 4 formed on the end surfaces 3 is covered with the insulation resin 13, as shows in FIG. 10(*a*). The insulation resin 13 flows over the end surfaces 3 when the electrodeposition insulation resin is deposited to the surface of the conductor 5 of the coil portion 7.

As a result, it is not likely that electrical contacts between the electrodes 9 and the conductive layers 4 are deteriorated, and that shape of the electrodes 9 becomes large due to the deposited insulation resin 13. It therefore improves connection reliability of the electrodes, and achieves downsizing of the chip inductor.

Since the cutting depth to cut the surfaces of the conductive layers 4 formed on the both end surfaces 3 is set to the extent not to expose the both end surfaces 3 of the substrate 1, a connection reliability between the conductive layers 4 and the electrodes 9 on the both end surfaces 3 when forming the electrodes 9 on the end surfaces 3 of the substrate 1 is improved.

Specifically, since surfaces of the conductive layers 4 formed on the both end surfaces 3 are cut by a plurality of laser beam scanning, the surfaces of the conductive layers 4 can be surely cut, thereby resulting in an improvement of connection reliability.

According to the third exemplary embodiment of the present invention, as described above, an external shape of the outer coating 8 never becomes round due to surface tension of the insulation resin 13 even if external dimensions are considerably small. And, it becomes such a shape that is generally the same with an external shape of the conductive layer 4, thereby making the outer coating 8 flat, and improving easiness of mounting to a circuit board or the like.

It also improves connection reliability of the electrodes 9 to the conductive layers 4 formed on the both end surfaces 3 of the substrate 1, while achieving miniaturization at the same time.

Figure 13:
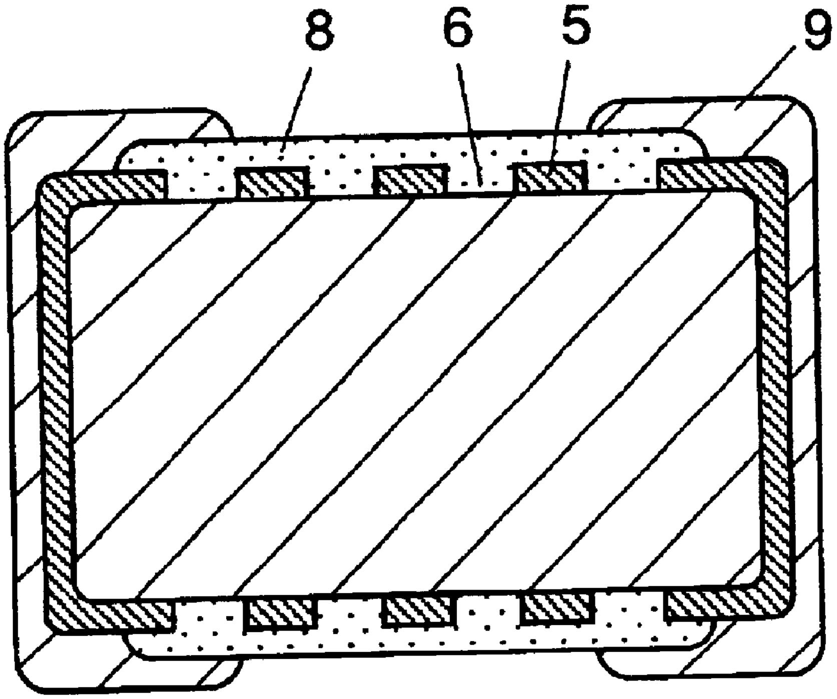
FIG. 13 is a sectional view of another chip inductor according to the third exemplary embodiment of the present invention.

According to this exemplary embodiment, the surfaces of the conductive layers 4 formed on the both end surfaces 3 of the substrate 1 are cut with laser irradiation in the electrode forming process. However, surfaces of the conductive layers 4 formed at edges of the outer periphery 2 of the substrate 1 may also be cut, as shown in FIG. 13, with the laser irradiation. This method can result in further improvement in connection reliability of the electrodes 9 to the conductive layers 4.

Fourth Exemplary Embodiment

Referring now to the accompanying drawings, the invention as set forth in claims 26 through claim 32 will be described hereinafter according to this exemplary embodiment.

A method of manufacturing chip inductor in the fourth exemplary embodiment is another improvement to the method of manufacturing the chip inductor of the first exemplary embodiment.

Figure 14:
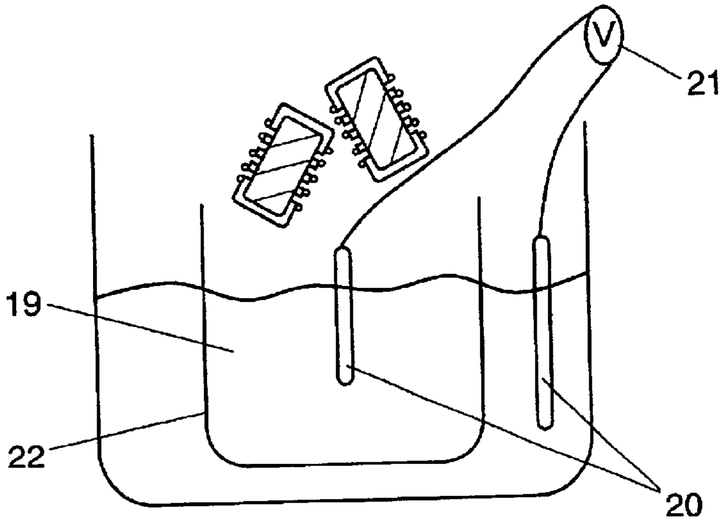
FIGS. 14(*a*) to 14(*c*) illustrate an etching process of a chip inductor according to a fourth exemplary embodiment of the present invention.
Figure 14:
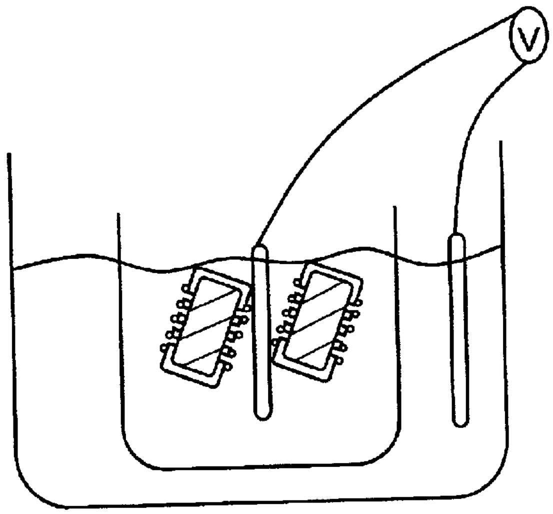
Figure 14:
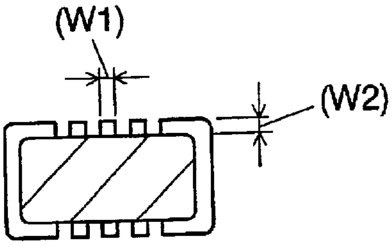
Figure 15:
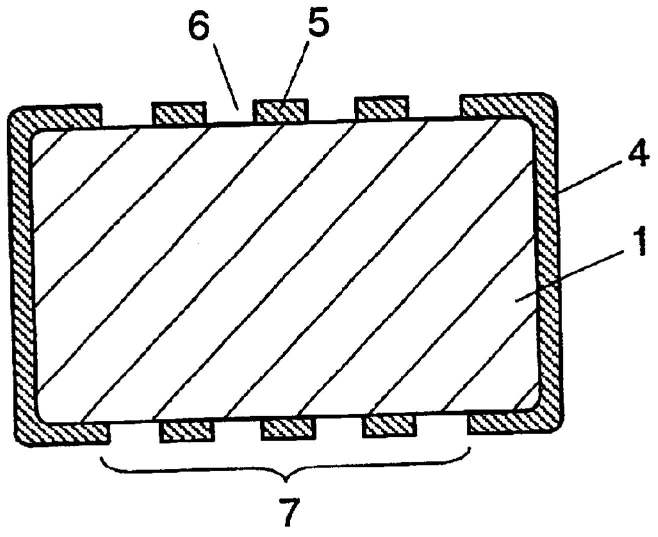
FIGS. 15(*a*) and 15(*b*) illustrate a process of forming an oxide film of the chip inductor.
Figure 15:
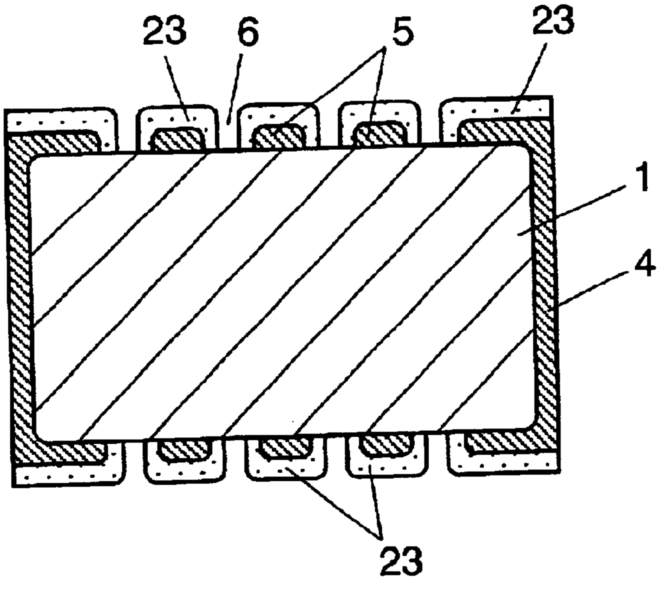
Figure 16:
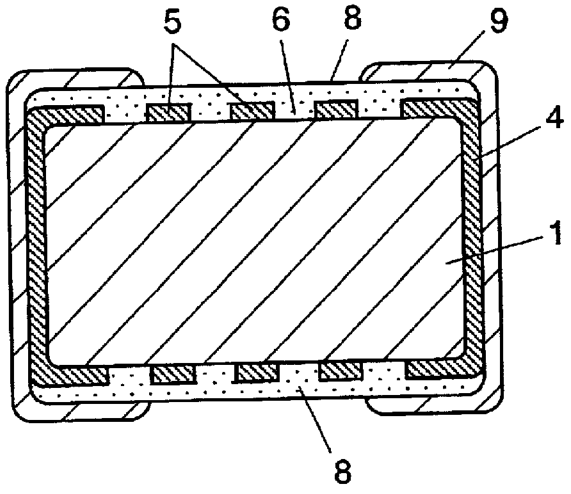
FIG. 16 is a sectional view of the chip inductor.
Figure 17:
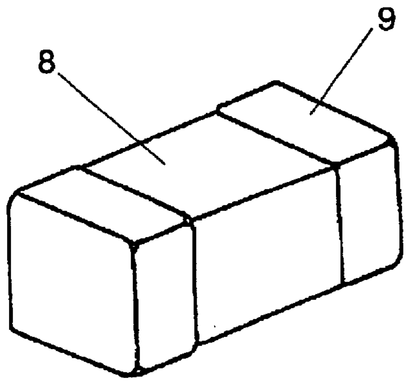
FIG. 17 is a perspective view of the chip inductor.
Figure 18:
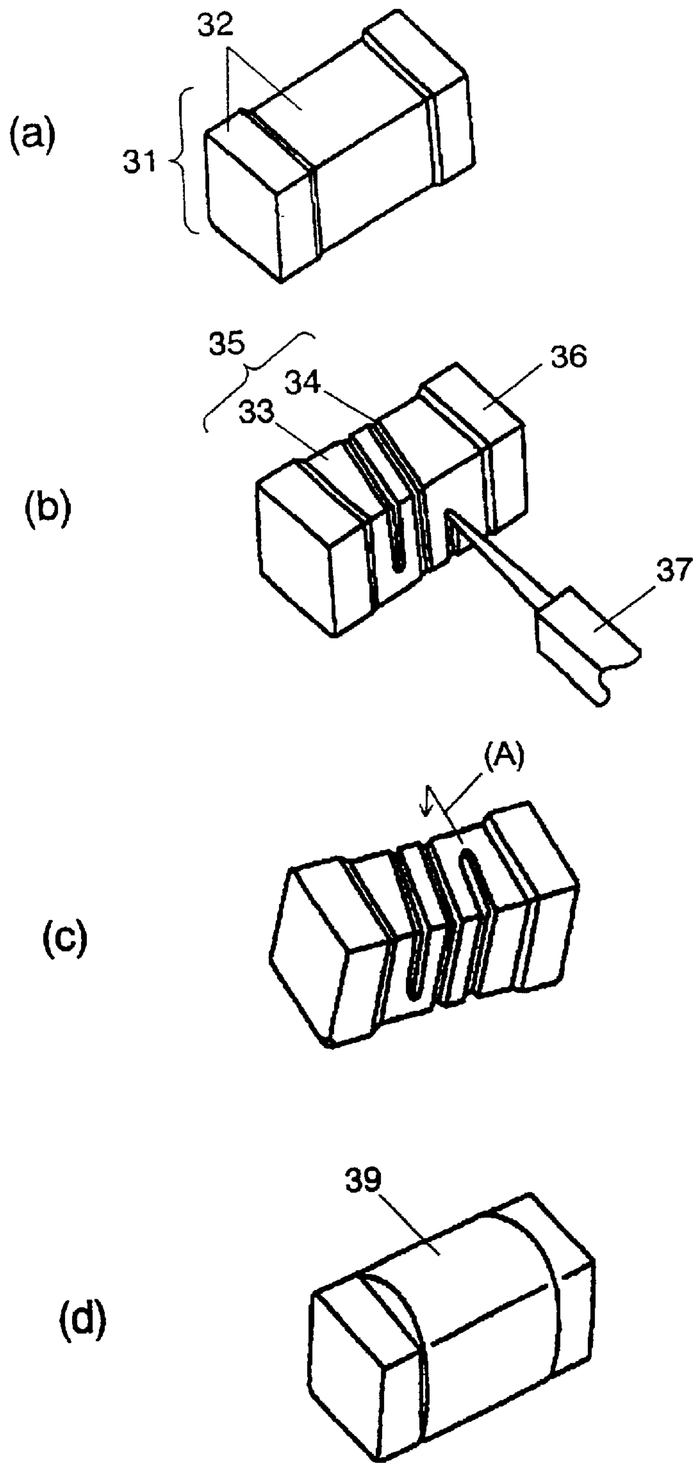
FIG. 18 Prior Art
FIGS. 18(*a*) to 18(*d*) illustrate a manufacturing process of a chip inductor of the prior art.
Figure 19:
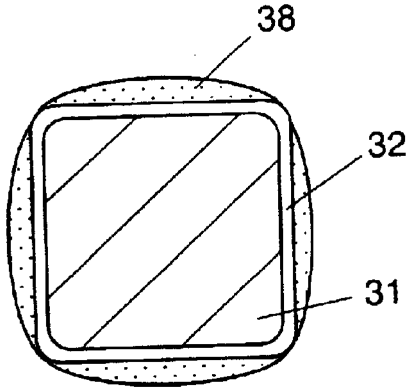
FIG. 19 Prior Art
FIG. 19 is a sectional view of the prior art chip inductor.
Figure 20:
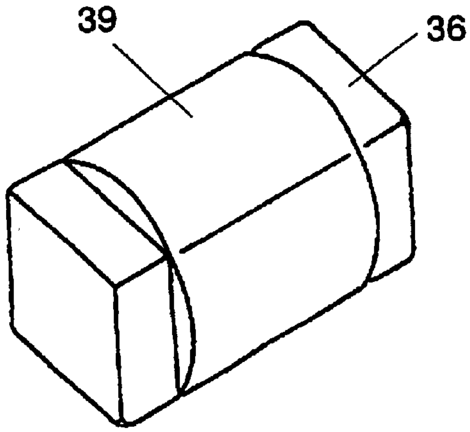
FIG. 20 Prior Art
FIG. 20 is a perspective view of the prior art chip inductor.

FIGS. 14(*a*) through 14(*c*) illustrate an etching process of chip inductor in the manufacturing process according to the fourth embodiment of the present invention, FIG. 15 illustrates a process showing formation of an oxide film in the manufacturing process of the chip inductor, FIG. 16 is a sectional view of the chip inductor, and FIG. 17 is a perspective view of the chip inductor. Detailed descriptions are omitted for the general manufacturing process and the electrodeposition coating process shown in FIG. 1 and FIG. 2, as they are same as those of the first exemplary embodiment.

In this exemplary embodiment, an etching process is provided as shown in FIGS. 14(*a*) through 14(*c*), wherein a chip inductor element, which has a groove by laser irradiation, is dipped into electrolytic solution 19, electric field is applied between conductive layer 4 and the electrolytic solution 19 with power supply 21 connected to a pair of electrode plates 20, and the element is electrolytically etched so that thickness (W2) of the conductive layer 4 becomes larger than width (W1) of conductor 5 of the coil portion 7.

In this etching process, the element is etched electrolytically in a manner that substrate 1 formed with conductive layer 4 is placed in vessel 22, one of the electrode plate 20 is inserted in the vessel 22, and electric field is applied between the conductive layer 4 and the electrolytic solution 19 through the pair of electrode plates 20 while the substrate 1 is kept in contact with the electrode plate 20.

Another process is provided, after the etching process, to form oxide film 23 over the conductor 5 of the coil portion 7, as shown in FIG. 15(*b*).

The following advantages are obtained through the above method, in addition to those obtained in the first exemplary embodiment.

It is that, cutting dust 10 produced during groove-cutting process of the conductive layer 4 can be removed, even if they remain firmly attached to surface of the conductive layer 4 and in grooves 6 of the substrate 1, since the substrate 1, after cutting with laser, is etched electrolytically.

As a result, it avoids adjoining conductors 5 from short-circuiting therebetween, and a film of the insulation resin 13 from becoming not uniform in the insulation resin coating process, and thereby the reliability can be improved.

Moreover, because the element is etched electrolytically by applying electric field between the conductive layer 4 of the substrate 1 and the electrolytic solution 19, while the element is placed in the vessel 22 and kept in contact with the electrode plate 20, it is possible to circulate the electrolytic solution 19 in contact with the conductive layer 4 efficiently for carrying out the etching successfully.

The etching process is specially provided so as to make thickness (W2) of the conductive layer 4 larger than width (W1) of the conductor 5 of the coil portion 7. This eliminates a reduction in inductance because a surface area of the conductor 5 does not decrease even when a number of turns of the conductor 5 is increased, thereby improving reliability.

In addition, there is provided a process of forming oxide film 23 on the conductor 5 after the etching process, which improves adhesion of the electrodeposited insulation resin 13 to the conductor 5. Consequently, it prevents peeling-off between the insulation resin 13 and the conductor 5, so as to positively avoid corrosion, disconnection, and the like of the coil. Moreover, there are cases, depending on kind of the electrodeposition resin, in which deposition of the insulation resin for electrodeposition on the surface of conductor 5 of the coil portion 7 can be facilitated by forming the oxide film 23. In general, a highly conductive material such as copper is used for the conductor 5. Since oxide layer of such material has electrical conductivity, it is unlikely that presence of the oxide layer prevents the electrodeposition.

In addition to the advantages of the first exemplary embodiment, the fourth exemplary embodiment of the present invention, as described, prevents adjoining conductors 5 from short-circuiting therebetween, and a film of the insulation resin 13 from becoming not uniform in the insulation resin coating process, and thereby the reliability is improved.

In this exemplary embodiment, the electrolytic etching process was disclosed. However, the same result is obtained even with a chemical etching process that uses acidic solution, in place of the electrolytic etching process.

And, when the element formed with the conductive layer 4 is chemically etched while being vibrated with ultrasonic wave, acidic solution in contact with the conductive layer 4 can be circulated efficiently, to successfully carry out the etching.

However, the electrolytic etching can shorten etching time, and is easy to control a degree of etching, and is capable of etching more precisely.

Furthermore, in the etching process of the fourth exemplary embodiment of the present invention, a process is provided, in which the substrate 1 is electrolytically etched so that the thickness (W2) of the conductive layer 4 becomes larger than the width (W1) of the conductor 5 of the coil portion 7. However, it is also acceptable to make the thickness (W2) of the conductive layer 4 smaller than the width (W1) of the conductor 5.

Industrial Applicability

According to the present invention, as described above, there is realized a chip inductor having an external shape that is generally the same with an external shape of conductive layer, since the external shape of its outer coating never becomes round due to surface tension of the insulation resin even if external dimensions of it are significantly small. Consequently, this can provide a method of manufacturing the chip inductor which makes the outer coating 8 flat, and improve easiness of mounting to a circuit board or the like.

What is claimed is:

1. A method of manufacturing a chip inductor comprising the steps of:

forming a conductive layer on an outer periphery of a substrate made of insulating material;

forming a coil by spirally cutting said conductive layer;

etching said coil;

forming an outer coating by coating at least said coil on said substrate with insulation resin; and forming an electrode at both ends of said coil and making an electric contact between said electrode and said conductive layer, wherein the step of forming an outer coating includes the step of using an electrodeposition method to deposit said insulation resin at least on a surface of a conductor of said coil, and wherein the step of forming an electrode includes forming said electrode on said conductive layer formed on the outer periphery of said substrate with said insulation resin in between.

2. The method of manufacturing a chip inductor according to claim 1, further comprising the steps of heating and curing said insulation resin, after using said electrodeposition method.

3. The method of manufacturing a chip inductor according to claim 2, further comprising the step of cleaning prior to the step of heating.

4. The method of manufacturing a chip inductor according to claim 2, wherein the step of heating comprises a first heating process for heating said insulation resin at a temperature lower than a curing temperature of said insulation resin, and a second heating process for heating said insulation resin thereafter at a temperature higher than the curing temperature of said insulation resin.

5. The method of manufacturing a chip inductor according to claim 2, wherein the step of heating comprises a heating and filling process for heating said insulation resin at a temperature lower than a curing temperature of said insulation resin for filling a groove in said coil portion with said insulation resin, and a second heating process for heating said insulation resin at a temperature higher than the curing temperature of said insulation resin for curing said insulation resin.

6. The method of manufacturing a chip inductor according to claim 4, wherein said first heating process is carried out at 130° C., and said second heating process is carried out at 230° C.

7. The method of manufacturing a chip inductor according to claim 5, wherein said heating and filling process is carried out at 130° C., and said second heating process is carried out at 230° C.

8. The method of manufacturing a chip inductor according to claim 1, wherein surfaces of said conductive layer formed on both end surfaces of said substrate are not in contact with an electrodeposition bath to maintain said surfaces free of deposition of said insulation resin.

9. The method of manufacturing a chip inductor according to claim 1, further including an electric-field controlling process in said electrodeposition method, wherein said electric-field controlling process ceases application of an electric field before a thickness of said insulation resin coating said coil becomes greater than a thickness of said conductive layer formed on the outer periphery of said substrate.

10. The method of manufacturing a chip inductor according to claim 1, wherein said insulation resin is epoxy-based resin.

11. The method of manufacturing a chip inductor according to claim 1, wherein the step of forming an electrode further comprises forming said electrode from an end surface of said substrate to at least a portion that faces said conductor with said insulation resin in between.

12. The method of manufacturing a chip inductor according to claim 1, wherein the step of forming an electrode further comprises forming said electrode in a manner to locate between an end surface of said substrate and said conductor that constitutes said coil.

13. The method of manufacturing a chip inductor according to claim 1, wherein the step of forming a conductive layer further comprises forming a conductive layer also on both end surfaces of said substrate, and the step of forming an electrode further comprises forming an electrode on said conductive layer formed on the end surface of said substrate.

14. The method of manufacturing a chip inductor according to claim 1, wherein the step of forming a conductive layer includes leaving portions free of conductive layer by not forming said conductive layer on both end surfaces of said substrate, and a process of leaving portions free of electrode by not forming said electrode on said end surfaces of said substrate.

15. The method of manufacturing a chip inductor according to claim 1, wherein the step of forming an electrode further comprises forming said electrode in a manner that a thickness of said electrode formed on the outer periphery of said substrate is smaller than a thickness of said insulation resin formed on the outer periphery of said substrate.

16. The method of manufacturing a chip inductor according to claim 1, wherein the step of forming an electrode comprises forming said electrode by coating conductive resin and curing said conductive resin.

17. The method of manufacturing a chip inductor according to claim 1, wherein the step of forming an electrode comprises forming said electrode by coating conductive resin, flattening a coated surface by pressing it against a flattening plate after said conductive resin is coated, and curing said conductive resin thereafter.

18. The method of manufacturing a chip inductor according to claim 1, wherein said electrode is formed in such a configuration that a length of said electrode located on the outer periphery of said substrate is larger than 1/6, but smaller than 1/2 of a dimension of said substrate, both said length and said dimension being taken along an axial direction of said coil.

19. The method of manufacturing a chip inductor according to claim 1, wherein said conductive layer is formed on both end surfaces of said substrate, and wherein the step of forming an electrode further comprises cutting a surface of said conductive layer formed on both end surfaces of said substrate.

20. The method of manufacturing a chip inductor according to claim 19, wherein in the step of forming an electrode, a cutting depth to cut the surface of said conductive layer formed on both end surfaces of said substrate is set to an extent not to expose both end surfaces of said substrate.

21. The method of manufacturing a chip inductor according to claim 19, wherein in the step of forming an electrode, the surface of said conductive layer formed on both end surfaces of said substrate is cut with a laser irradiation.

22. The method of manufacturing a chip inductor according to claim 21, wherein said laser irradiation is performed by scanning the surface of said conductive layer for a plurality of times.

23. The method of manufacturing a chip inductor according to claim 19, wherein in the step of forming an electrode, the surface of said conductive layer formed on both end surfaces of said substrate and the surface of said conductive layer formed on an end portion of said outer periphery of said substrate are cut with laser irradiation.

24. The method of manufacturing a chip inductor according to claim 23, wherein said laser irradiation is performed by scanning the surface of said conductive layer for a plurality of times.

25. The method of manufacturing a chip inductor according to claim 1, wherein the step of etching said coil comprises electrolytic etching with application of an electric field between said conductive layer on the surface of said substrate and the electrolytic solution.

26. The method of manufacturing a chip inductor according to claim 25, further comprising the step of forming an oxide film on the conductor of said coil on said substrate, after the step of etching said coil.

27. The method of manufacturing a chip inductor according to claim 25, wherein the electrolytic etching is carried out while said conductive layer is kept in contact with an electrode plate for application of electric field.

28. The method of manufacturing a chip inductor according to claim 25, wherein the electrolytic etching is carried out in a manner that said substrate having said conductive layer formed thereon is placed in an electrically conductive vessel, electric field is applied between said conductive layer and electrolytic solution through said vessel while said substrate is kept in contact with said vessel.

29. The method of manufacturing a chip inductor according to claim 25, wherein the electrolytic etching is carried out so that a thickness of said conductive layer becomes larger than a width of the conductor of said coil.

30. The method of manufacturing a chip inductor according to claim 1, wherein the step of etching said coil is a chemical etching process.

31. The method of manufacturing a chip inductor according to claim 1, wherein the step of etching said coil is a chemical etching process with ultrasonic vibration.

* * * * *